United States Patent
Lee et al.

(10) Patent No.: US 11,057,700 B1
(45) Date of Patent: Jul. 6, 2021

(54) MICROPHONE DEVICE, TELEPHONE DEVICE, AND DECOUPLING CIRCUIT

(71) Applicant: Wistron Corporation, New Taipei (TW)

(72) Inventors: Hsin-Chun Lee, New Taipei (TW); I-Ming Chen, New Taipei (TW); Chang-Yi Hsueh, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/784,246

(22) Filed: Feb. 7, 2020

(30) Foreign Application Priority Data

Dec. 17, 2019 (TW) .................................. 108146159

(51) Int. Cl.
*H04R 3/00* (2006.01)
*H03F 3/00* (2006.01)
*H04R 19/04* (2006.01)

(52) U.S. Cl.
CPC .............. *H04R 3/00* (2013.01); *H03F 3/005* (2013.01); *H04R 19/04* (2013.01); *H04R 2499/11* (2013.01)

(58) Field of Classification Search
CPC ...... H04R 3/00; H04R 19/04; H04R 2499/11; H04R 19/02; H04R 2499/15; H04R 29/004; H04R 3/04; H03F 3/005; H03F 1/304; H03F 1/301; H03F 1/3205; H03F 3/183
See application file for complete search history.

(56) References Cited

FOREIGN PATENT DOCUMENTS

| CN | 201590804 |  | 9/2010 |  |
|----|-----------|--|--------|--|
| CN | 204316702 |  | 5/2015 |  |
| CN | 105187992 |  | 12/2015 |  |
| CN | 105187992 | A * | 12/2015 |  |
| EP | 2541765 |  | 1/2013 |  |
| EP | 2541765 | A1 * | 1/2013 | ............. H03F 1/301 |

OTHER PUBLICATIONS

"Office Action of Taiwan Counterpart Application", dated Dec. 2, 2020, p. 1-p. 7.

* cited by examiner

*Primary Examiner* — Yogeshkumar Patel
(74) *Attorney, Agent, or Firm* — JCIPRNET

(57) ABSTRACT

A microphone device, a telephone device, and a decoupling circuit are provided. The decoupling circuit includes a first capacitor, a first resistor, and a switch. A first terminal of the first capacitor is coupled to a first terminal of an audio source. A first terminal of the first resistor is coupled to a second terminal of the first capacitor, and a second terminal of the first resistor is coupled to a second terminal of the audio source. A first terminal of the switch is coupled to the second terminal of the first capacitor and the first terminal of the first resistor, and a second terminal of the switch is coupled to the second terminal of the audio source. The first capacitor and the first resistor are configured to absorb noise generated by the switch during switching.

6 Claims, 5 Drawing Sheets

MICROPHONE DEVICE, TELEPHONE DEVICE, AND DECOUPLING CIRCUIT

CROSS-REFERENCE TO RELATED APPLICATION

This application claims the priority benefit of Taiwan application serial no. 108146159, filed on Dec. 17, 2019. The entirety of the above-mentioned patent application is hereby incorporated by reference herein and made a part of this specification.

BACKGROUND OF THE INVENTION

1. Field of the Invention

The invention relates to a circuit design technology of eliminating noise, and more particularly, to a microphone device, a telephone device, and a decoupling circuit which eliminate noise.

2. Description of Related Art

Internet telephony (or referred to as Voice over Internet Protocol (VoIP)) achieves a voice call and a multimedia conference through the Internet Protocol (IP), that is, performs communications through the Internet. In addition, during a call, when a user is in a noisy environment or having a confidential conversation, the user hopes that a microphone of the Internet telephony can switch to a silent mode, to prevent content of the conversation or background noise from affecting quality of the call or the conference and causing a leak or unpleasant sound in the conference.

However, because the microphone of the Internet telephony usually uses only a simple mechanical switch to implement switching to the silent mode, it causes noise on the speaker of the other side and results in poor sound quality.

SUMMARY OF THE INVENTION

The invention provides a microphone device, a telephone device, and a decoupling circuit, wherein a mute button is designed on the microphone device, and noise generated by the mute button when pressed (that is, during switching of a circuit switch) is eliminated, to prevent the other party on a call from perceiving the press of the mute button.

The decoupling circuit in an embodiment of the invention includes a first capacitor, a first resistor, and a switch. A first terminal of the first capacitor is coupled to a first terminal of an audio source. A first terminal of the first resistor is coupled to a second terminal of the first capacitor, and a second terminal of the first resistor is coupled to a second terminal of the audio source. A first terminal of the switch is coupled to the second terminal of the first capacitor and the first terminal of the first resistor. A second terminal of the switch is coupled to the second terminal of the audio source. The first capacitor and the first resistor are configured to absorb noise generated by the switch during switching.

The microphone device in an embodiment of the invention includes an audio source, a first capacitor, a first resistor, and a switch. A first terminal of the first capacitor is coupled to a first terminal of the audio source. A first terminal of the first resistor is coupled to a second terminal of the first capacitor, and a second terminal of the first resistor is coupled to a second terminal of the audio source. A first terminal of the switch is coupled to the second terminal of the first capacitor and the first terminal of the first resistor. A second terminal of the switch is coupled to the second terminal of the audio source. The first capacitor and the first resistor are configured to absorb noise generated by the switch during switching. A first output terminal of the microphone device provides an audio signal according to one of the first terminal and the second terminal of the audio source.

A telephone device in an embodiment of the invention includes a microphone device and a telephone set device. The telephone set device is coupled to the microphone device to receive an audio signal. The microphone device includes an audio source, a first capacitor, a first resistor, and a switch. A first terminal of the first capacitor is coupled to a first terminal of the audio source. A first terminal of the first resistor is coupled to a second terminal of the first capacitor, and a second terminal of the first resistor is coupled to a second terminal of the audio source. A first terminal of the switch is coupled to the second terminal of the first capacitor and the first terminal of the first resistor. A second terminal of the switch is coupled to the second terminal of the audio source. A first output terminal of the microphone device provides an audio signal according to one of the first terminal and the second terminal of the audio source. The first capacitor and the first resistor are configured to absorb noise generated by the switch during switching.

Based on the above, in the embodiments of the invention, the mute button is designed on the microphone device, and the decoupling circuit is designed to eliminate noise generated by the mute button when pressed (that is, during switching of the circuit switch), to prevent the other party on the call from perceiving the press of the mute button. In this way, the microphone device (which may also be referred to as a push-to-talk microphone) with the mute button and the telephone device in the embodiments of the invention can implement a mute function without being perceived by the other party of the call, so that content of a conversation of the present party, background noise, and the noise during switching are prevented from affecting quality of the call.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In embodiments of the invention, a mute button is designed on a microphone device, and a push-to-talk microphone and a decoupling circuit are used to eliminate noise generated by a switch when the mute button is pressed. Therefore, a simple circuit design may be applied to various microphone transmission circuits, for example, may be applied to a single-ended input microphone and a differential input microphone. In addition to being implemented as a push-to-talk microphone and a telephone, the microphone device in the embodiments of the invention may further be applied to any electronic device with a microphone such as Internet telephony, a headset with a microphone (for example, a headset with headset terminals of 2.5/3.5 mm), or a handheld microphone. The following provides a plurality of embodiments for description.

Figure 1:
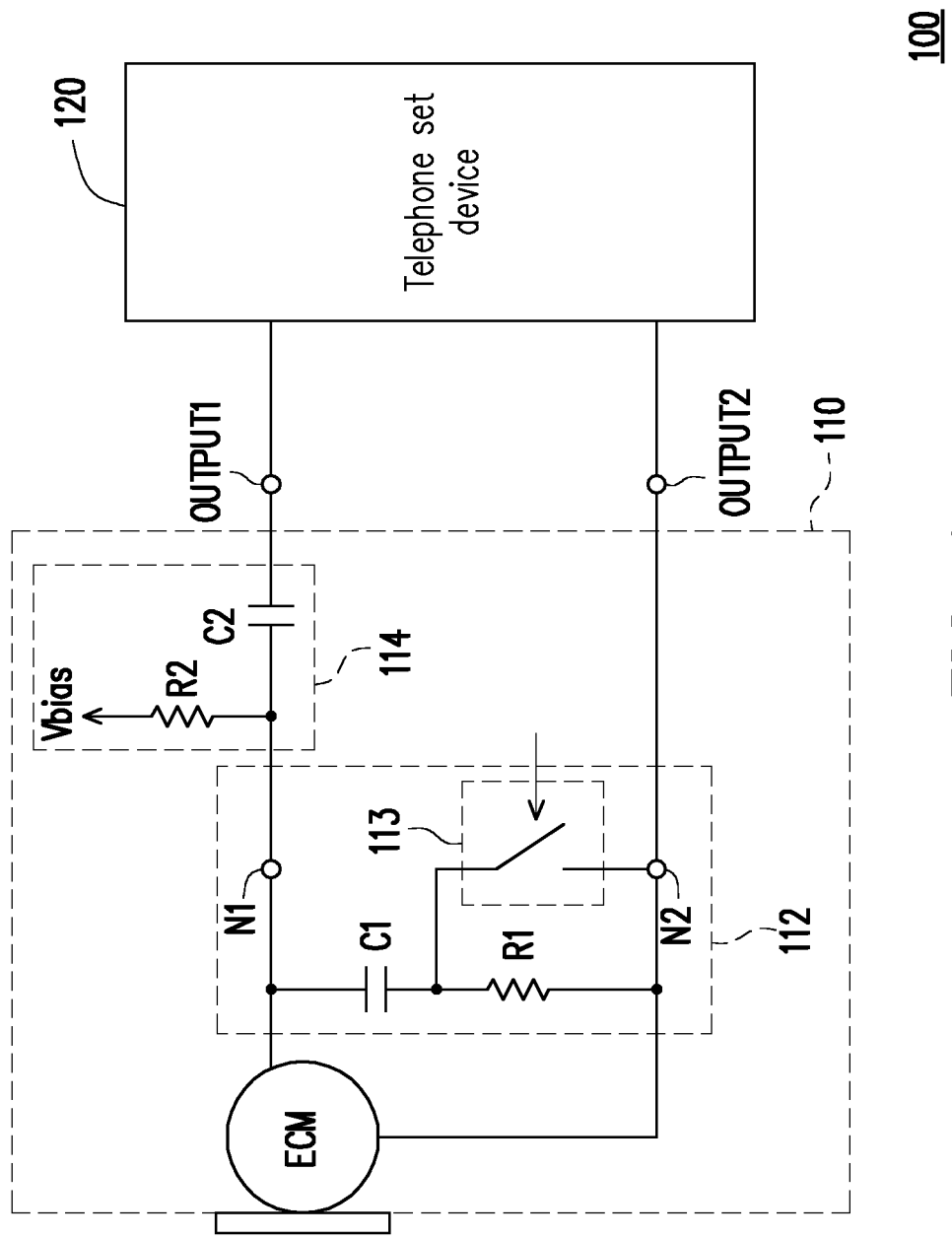
FIG. 1 is a schematic circuit diagram of a telephone device according to a first embodiment of the invention.

FIG. 1 is a schematic circuit diagram of a telephone device 100 according to a first embodiment of the invention. The telephone device 100 includes a microphone device 110 and a telephone set device 120. The microphone device 110 mainly includes an audio source (for example, a microphone ECM) and a decoupling circuit 112. In addition, because the microphone ECM in the present embodiment is a single-ended input microphone, the microphone device 110 further includes a first resistor-capacitor circuit 114.

The microphone ECM includes a first terminal N1 and a second terminal N2. Because the microphone ECM in FIG. 1 of the present embodiment is a single-ended input microphone ECM, the first terminal N1 is an output terminal of the microphone ECM, and the second terminal N2 is a ground terminal of the microphone ECM. In an application of the present embodiment, the first terminal N1 may be considered as the ground terminal of the microphone ECM and the second terminal N2 may be considered as the output terminal of the microphone ECM according to requirements.

The decoupling circuit 112 includes a first capacitor C1, a first resistor R1, and a switch 113. A first terminal of the first capacitor C1 is coupled to the first terminal N1 of the audio source (the microphone ECM). A first terminal of the first resistor R1 is coupled to a second terminal of the first capacitor C1. A second terminal of the first resistor R1 is coupled to the second terminal N2 of the audio source (the microphone ECM). A first terminal of the switch 113 is coupled to the second terminal of the first capacitor C1 and the first terminal of the first resistor R1. A second terminal of the switch 113 is coupled to the second terminal N2 of the audio source (the microphone ECM). The first capacitor C1 and the first resistor R1 are configured to absorb noise generated by the switch 113 during switching.

In the present embodiment, the switch 113 is controlled by a mute button disposed on the microphone device 110 to turn on or turn off. When the decoupling circuit 112 is powered and enabled and the mute button is not pressed, the switch 113 turns on, and the first terminal and the second terminal of the switch 113 are connected to charge the first capacitor C1. Correspondingly, when the mute button is pressed, the switch 113 turns off, and the first terminal and the second terminal of the switch 113 are disconnected. In this way, a current generated due to the noise flows through the first resistor R1.

The noise generated by the switch 113 during switching between turning on and turning off is absorbed by a parallel structure of the first capacitor C1 and the first resistor R1, thereby preventing noise from being generated on the first terminal N1 and the second terminal N2 of the microphone ECM. Specifically, because the microphone ECM has a smaller impedance while the first resistor R1 has a larger impedance, a current carrying an audio signal mainly passes through the microphone ECM. Correspondingly, the noise or an alternating current surge is received by the first resistor R1 with a relatively large impedance and the first capacitor C1 with a relatively large capacitance. In this way, the telephone set device 120 does not generate an audio signal due to the noise generated during switching of the switch 113 because the noise has been absorbed by the first capacitor C1 and the first resistor R1 in the decoupling circuit 112. Therefore, the other side of the call does not notice that the microphone device 110 switches to a silent mode or a normal receiver mode.

The first resistor-capacitor circuit 114 is coupled between the first terminal N1 of the audio source (the microphone ECM) and a first output terminal OUTPUT1 of the microphone device 110. Specifically, the first resistor-capacitor circuit 114 includes a second capacitor C2 and a second resistor R2. A first terminal of the second capacitor C2 is coupled to the first terminal N1 of the audio source (the microphone ECM), and a second terminal of the second capacitor C2 is coupled to the first output terminal OUTPUT1 of the microphone device 110. A first terminal of the second resistor R2 is coupled to a bias voltage Vbias, and a second terminal of the second resistor R2 is coupled to the first terminal N1 of the audio source (the microphone ECM). In this way, an audio signal on the first terminal N1 of the audio source (the microphone ECM) is transmitted to the telephone set device 120 by using the first output terminal OUTPUT1 through AC coupling of the second resistor R2 and the second capacitor C2.

The telephone set device 120 is coupled to the first output terminal OUTOUT1 and a second output terminal OUTPUT2 of the microphone device 110, to receive an audio signal from the microphone device 110. The telephone set device 120 includes an audio processor (for example, an integrated circuit for the single-ended input microphone), to process the audio signal provided by the first terminal N1 of the audio source (the microphone ECM). In the present embodiment, an Internet telephone is used as an embodiment. Therefore, the telephone set device 120 further communicates with other Internet telephones through the Internet. In an application of the present embodiment, the decoupling circuit 112 or the microphone device 110 that conforms to the present embodiment of the invention may be applied to other types of telephone sets, headset microphones, or other electronic devices according to requirements, and such application is not limited to the present embodiment.

Figure 2:
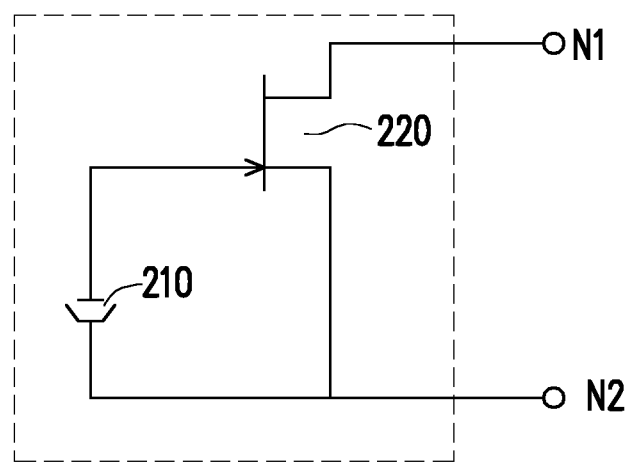
FIG. 2 is a circuit diagram of a single-ended input microphone in FIG. 1.

A schematic diagram of a circuit in the single-ended input microphone ECM is used herein as an example for description, and in an application of the present embodiment, any type of single-ended input microphone may be used to implement the microphone ECM in FIG. 1. FIG. 2 is a circuit diagram of the single-ended input microphone ECM in FIG. 1. The microphone ECM mainly includes a diaphragm 210 and a pre-amplifier 220, and the microphone ECM has a first terminal N1 and a second terminal N2. The microphone ECM is biased by a direct current bias on the first terminal N1 and the second terminal N2. The bias uses a bias resistor to provide a voltage level, and an input signal obtained by the first terminal N1 of the microphone ECM and the pre-amplifier 220 from the diaphragm 210 goes through the AC coupling of the second capacitor C2 and the second resistor R2 in FIG. 1, so that an audio signal of the microphone ECM is transmitted to the first output terminal OUTPUT1 of the microphone device 110 in FIG. 1 through the first terminal N1.

Figure 3:
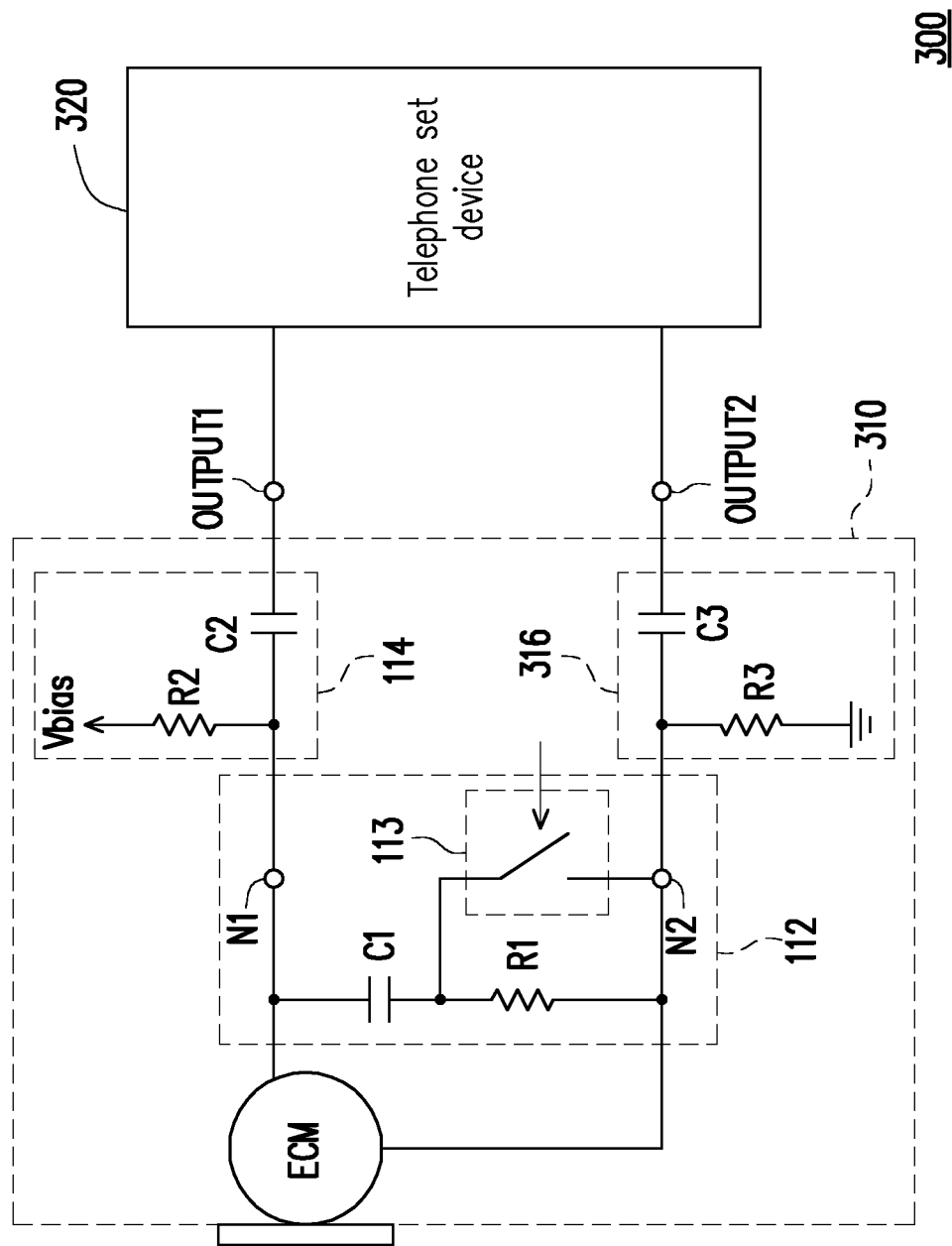
FIG. 3 is a schematic circuit diagram of a telephone device according to a second embodiment of the invention.

FIG. 3 is a schematic circuit diagram of a telephone device 300 according to a second embodiment of the invention. A difference between the telephone device 300 in FIG. 3 and the telephone device 100 in FIG. 1 mainly lies in that, the telephone device 300 in FIG. 3 uses a differential input microphone ECM and a corresponding telephone set device 320. In an application of the present embodiment, any type of differential input microphone ECM may be used to implement the microphone ECM in FIG. 3. Therefore, in addition to the microphone ECM, the decoupling circuit 112, and the first resistor-capacitor circuit 114, the telephone device 300 in FIG. 3 further includes a second resistor-capacitor circuit 316. The first resistor-capacitor circuit 114 is coupled between a first terminal N1 of an audio source (the microphone ECM) and a first output terminal OUTPUT1 of a microphone device 310.

The second resistor-capacitor circuit 316 is coupled between a second terminal N2 of the audio source (the microphone ECM) and a second output terminal OUTPUT2 of the microphone device 310. Specifically, the second resistor-capacitor circuit 316 includes a third capacitor C3 and a third resistor R3. A first terminal of the third capacitor C3 is coupled to the second terminal N2 of the audio source (the microphone ECM), and a second terminal of the third capacitor C3 is coupled to the second output terminal OUTPUT2 of the microphone device 310. A first terminal of the third resistor R3 is coupled to a reference voltage terminal (for example, a ground terminal). A second terminal of the third resistor R3 is coupled to the second terminal N2 of the audio source (the microphone ECM). In this way, an audio signal on the second terminal N2 of the audio source (the microphone ECM) is transmitted to the telephone set device 320 by using the second output terminal OUTPUT2 through AC coupling of the third resistor R3 and the third capacitor C3. The telephone set device 320 receives and processes a differential audio signal on the first output terminal OUTPUT1 and the second output terminal OUTPUT2 of the microphone device 310.

Figure 4:
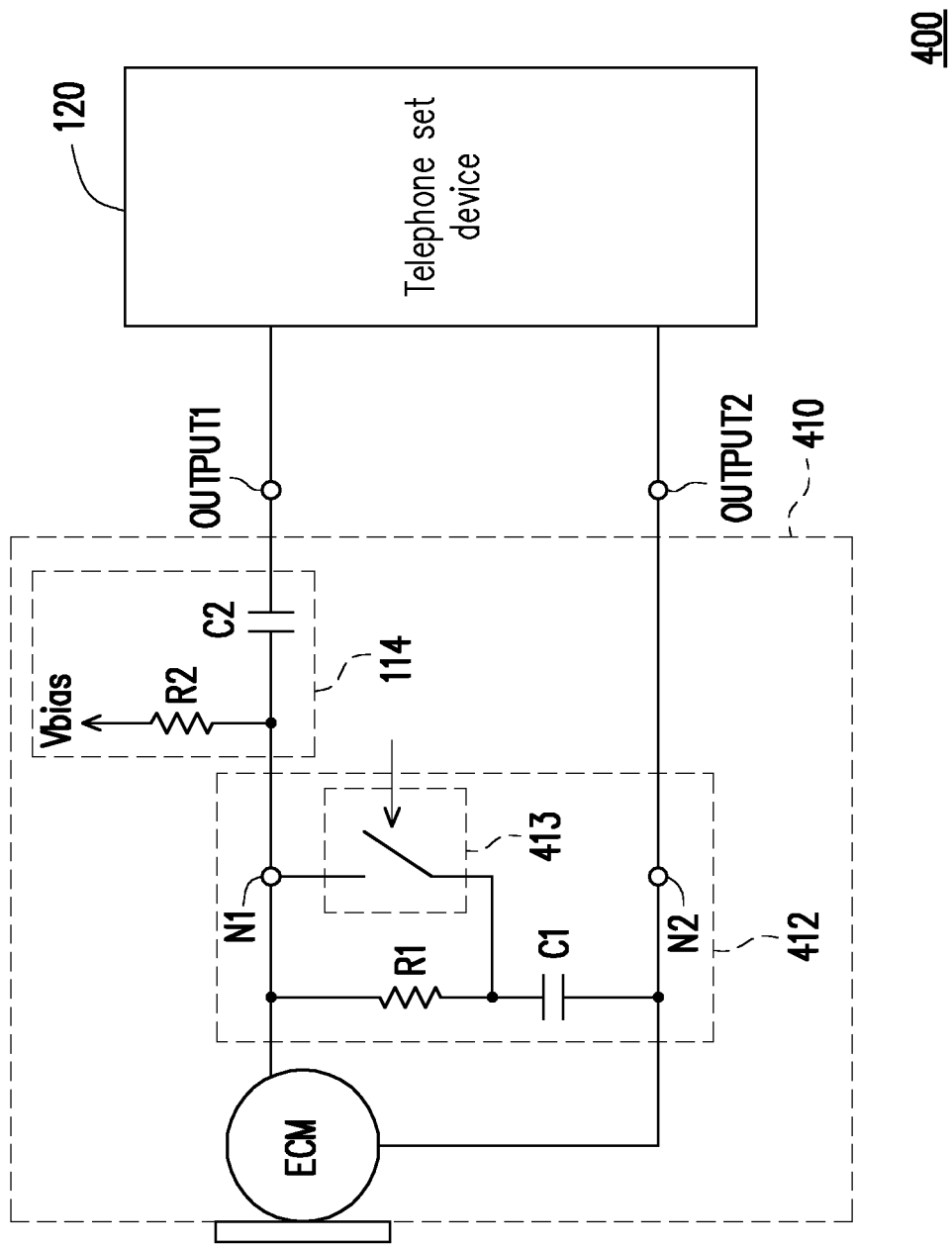
FIG. 4 is a schematic circuit diagram of a telephone device according to a third embodiment of the invention.

FIG. 4 is a schematic circuit diagram of a telephone device 400 according to a third embodiment of the invention. The telephone device 400 in FIG. 4 includes a microphone device 410 and a telephone set device 120, and the microphone device 410 includes a microphone ECM, a decoupling circuit 412, and a first resistor-capacitor circuit 114. A difference between the telephone device 400 in FIG. 4 and the telephone device 100 in FIG. 1 mainly lies in that, a connection relationship between circuit components of the decoupling circuit 412 in the microphone device 410 in FIG. 4 is different from that of the decoupling circuit 112 in FIG. 1. A first terminal of a first capacitor C1 in the decoupling circuit 412 is coupled to a second terminal N2 of an audio source (the microphone ECM). A first terminal of a first resistor R1 is coupled to a second terminal of a first capacitor C1. A second terminal of the first resistor R1 is coupled to a first terminal N1 of the audio source (the microphone ECM). A first terminal of a switch 413 is coupled to the second terminal of the first capacitor C1 and the first terminal of the first resistor R1. A second terminal of the switch 413 is coupled to the first terminal N1 of the audio source (the microphone ECM). The first capacitor C1 and the first resistor R1 in FIG. 4 are configured to absorb noise generated by the switch 413 during switching.

Figure 5:
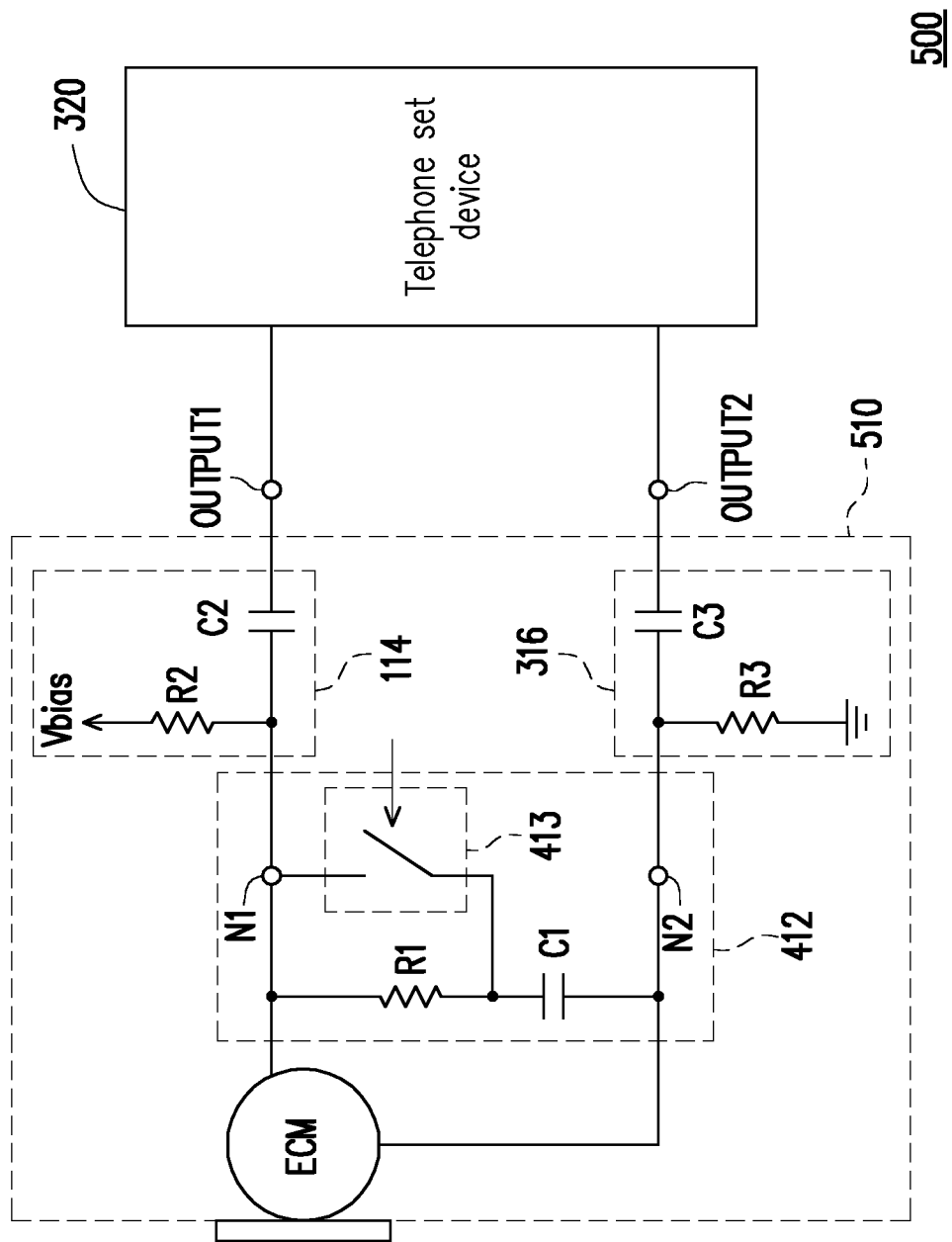
FIG. 5 is a schematic circuit diagram of a telephone device according to a fourth embodiment of the invention.

FIG. 5 is a schematic circuit diagram of a telephone device 500 according to a fourth embodiment of the invention. The telephone device 500 in FIG. 5 includes a microphone device 510 and a telephone set device 320, and the microphone device 510 includes a microphone ECM, a decoupling circuit 412, a first resistor-capacitor circuit 114, and a second resistor-capacitor circuit 316. A difference between the telephone device 500 in FIG. 5 and the telephone device 300 in FIG. 3 mainly lies in that, a connection relationship between circuit components of the decoupling circuit 412 in the microphone device 510 in FIG. 5 is modified to be the same as that of the decoupling circuit 412 in FIG. 4. The telephone set device 320 receives and processes a differential audio signal on a first output terminal OUTPUT1 and a second output terminal OUTPUT2 of the microphone device 510.

Based on the above, in the embodiments of the invention, the mute button is designed on the microphone device, and the decoupling circuit is designed to eliminate noise generated by the mute button when pressed (that is, during switching of the circuit switch), to prevent the other party on the call from perceiving the press of the mute button. In this way, the microphone device (which may also be referred to as a push-to-talk microphone) with the mute button and the telephone device in the embodiments of the invention can implement a mute function without being perceived by the other party of the call, so that content of a conversation of the present party, background noise, and the noise during switching are prevented from affecting quality of the call.

It will be apparent to those skilled in the art that various modifications and variations can be made to the embodiments of the present invention without departing from the scope or spirit of the invention. In view of the foregoing, it is intended that the present invention cover modifications and variations of this invention provided they fall within the scope of the following claims and their equivalents.

What is claimed is:

1. A decoupling circuit, comprising:
   a first capacitor, wherein a first terminal of the first capacitor is coupled to a first terminal of an audio source;
   a first resistor, wherein a first terminal of the first resistor is coupled to a second terminal of the first capacitor, and a second terminal of the first resistor is coupled to a second terminal of the audio source; and
   a switch, wherein a first terminal of the switch is coupled to the second terminal of the first capacitor and the first terminal of the first resistor, and a second terminal of the switch is coupled to the second terminal of the audio source,
   wherein the first capacitor and the first resistor are configured to absorb noise generated by the switch during switching,
   wherein when the audio source is a differential input, the decoupling circuit further comprises:
   a second capacitor, wherein a first terminal of the second capacitor is coupled to one of the first terminal and the second terminal of the audio source, and a second terminal of the second capacitor is coupled to a first output terminal;
   a second resistor, wherein a first terminal of the second resistor is coupled to a bias voltage, and a second terminal of the second resistor is coupled to the one of the first terminal and the second terminal of the audio source;
   a third capacitor, wherein a first terminal of the third capacitor is coupled to the other one of the first terminal and the second terminal of the audio source, and a second terminal of the third capacitor is coupled to a second output terminal; and
   a third resistor, wherein a first terminal of the third resistor is coupled to a reference voltage terminal, and a second terminal of the third resistor is coupled to the other one of the first terminal and the second terminal of the audio source and the first terminal of the third capacitor.

2. The decoupling circuit according to claim 1, wherein when the decoupling circuit is enabled and the switch is not pressed, the first terminal and the second terminal of the switch are connected to charge the first capacitor, and when the switch is pressed, the first terminal and the second terminal of the switch are disconnected.

3. The decoupling circuit according to claim 1, wherein the audio source is a microphone.

4. A microphone device, comprising:
an audio source;
a first capacitor, wherein a first terminal of the first capacitor is coupled to a first terminal of the audio source;
a first resistor, wherein a first terminal of the first resistor is coupled to a second terminal of the first capacitor, and a second terminal of the first resistor is coupled to a second terminal of the audio source; and
a switch, wherein a first terminal of the switch is coupled to the second terminal of the first capacitor and the first terminal of the first resistor, and a second terminal of the switch is coupled to the second terminal of the audio source,
wherein the first capacitor and the first resistor are configured to absorb noise generated by the switch during switching, and
a first output terminal of the microphone device provides an audio signal according to one of the first terminal and the second terminal of the audio source,
wherein when the audio source is a differential input, the microphone device further comprises:
a second capacitor, wherein a first terminal of the second capacitor is coupled to one of the first terminal and the second terminal of the audio source, and a second terminal of the second capacitor is coupled to a first output terminal;
a second resistor, wherein a first terminal of the second resistor is coupled to a bias voltage, and a second terminal of the second resistor is coupled to the one of the first terminal and the second terminal of the audio source;
a third capacitor, wherein a first terminal of the third capacitor is coupled to the other one of the first terminal and the second terminal of the audio source, and a second terminal of the third capacitor is coupled to a second output terminal; and
a third resistor, wherein a first terminal of the third resistor is coupled to a reference voltage terminal, and a second terminal of the third resistor is coupled to the other one of the first terminal and the second terminal of the audio source and the first terminal of the third capacitor.

5. The microphone device according to claim 4, wherein when the microphone device is enabled the switch is not pressed, the first terminal and the second terminal of the switch are connected to charge the first capacitor, and when the switch is pressed, the first terminal and the second terminal of the switch are disconnected.

6. A telephone device, comprising:
a microphone device; and
a telephone set device, coupled to the microphone device to receive an audio signal,
wherein the microphone device comprises:
an audio source;
a first capacitor, wherein a first terminal of the first capacitor is coupled to a first terminal of the audio source;
a first resistor, wherein a first terminal of the first resistor is coupled to a second terminal of the first capacitor, and a second terminal of the first resistor is coupled to a second terminal of the audio source; and
a switch, wherein a first terminal of the switch is coupled to the second terminal of the first capacitor and the first terminal of the first resistor, and a second terminal of the switch is coupled to the second terminal of the audio source,
wherein a first output terminal of the microphone device provides an audio signal according to one of the first terminal and the second terminal of the audio source, and
the first capacitor and the first resistor are configured to absorb noise generated by the switch during switching,
wherein when the audio source is a differential input, the telephone device further comprises:
a second capacitor, wherein a first terminal of the second capacitor is coupled to one of the first terminal and the second terminal of the audio source, and a second terminal of the second capacitor is coupled to a first output terminal;
a second resistor, wherein a first terminal of the second resistor is coupled to a bias voltage, and a second terminal of the second resistor is coupled to the one of the first terminal and the second terminal of the audio source;
a third capacitor, wherein a first terminal of the third capacitor is coupled to the other one of the first terminal and the second terminal of the audio source, and a second terminal of the third capacitor is coupled to a second output terminal; and
a third resistor, wherein a first terminal of the third resistor is coupled to a reference voltage terminal, and a second terminal of the third resistor is coupled to the other one of the first terminal and the second terminal of the audio source and the first terminal of the third capacitor.

* * * * *